United States Patent
DiDomenico

(10) Patent No.: US 7,863,517 B1
(45) Date of Patent: Jan. 4, 2011

(54) ELECTRIC POWER GENERATOR BASED ON PHOTON-PHONON INTERACTIONS IN A PHOTONIC CRYSTAL

(75) Inventor: Leo David DiDomenico, Livermore, CA (US)

(73) Assignee: Xtreme Energetics, Inc., Livermore, CA (US)

( * ) Notice: Subject to any disclaimer, the term of this patent is extended or adjusted under 35 U.S.C. 154(b) by 882 days.

(21) Appl. No.: 11/215,046

(22) Filed: Aug. 30, 2005

(51) Int. Cl.
*H01L 31/00* (2006.01)
*H01L 35/30* (2006.01)
*H01J 1/62* (2006.01)
*H01S 3/00* (2006.01)

(52) U.S. Cl. ............... 136/253; 136/246; 136/291; 250/493.1; 313/501; 359/341.5; 117/200

(58) Field of Classification Search ............ 136/253, 136/246, 291; 250/493.1; 313/501; 359/341.5; 117/200
See application file for complete search history.

(56) References Cited

U.S. PATENT DOCUMENTS

| | | | | |
|---|---|---|---|---|
| 4,316,048 A | * | 2/1982 | Woodall | 136/253 |
| 4,584,426 A | * | 4/1986 | Nelson | 136/253 |
| 4,707,560 A | * | 11/1987 | Hottel et al. | 136/253 |
| 4,750,943 A | * | 6/1988 | Nelson | 136/253 |
| 4,755,350 A | * | 7/1988 | Kennel | 376/321 |
| 4,776,895 A | * | 10/1988 | Goldstein | 136/253 |
| 4,836,862 A | * | 6/1989 | Pelka et al. | 136/253 |
| 4,976,606 A | * | 12/1990 | Nelson | 431/79 |
| 5,066,339 A | * | 11/1991 | Dehlsen | 136/253 |
| 5,209,071 A | * | 5/1993 | Cheng | 62/637 |
| 5,439,532 A | * | 8/1995 | Fraas | 136/253 |
| 5,512,109 A | * | 4/1996 | Fraas et al. | 136/253 |
| 5,518,554 A | * | 5/1996 | Newman | 136/248 |
| 5,551,992 A | * | 9/1996 | Fraas | 136/253 |
| 5,560,783 A | * | 10/1996 | Hamlen | 136/253 |
| 5,593,509 A | * | 1/1997 | Zuppero et al. | 136/253 |
| 5,772,793 A | * | 6/1998 | Ashcroft et al. | 136/253 |

(Continued)

FOREIGN PATENT DOCUMENTS

JP         2004072823  A  *  3/2004

OTHER PUBLICATIONS

Lin et al., "Enhancement and suppression of thermal emission by a three-dimensional photonic crystal", Phys. Rev. B 62, R2243 - R2246 (2000).*

Zakhidov et al., "Three-dimensionally periodic conductive nanostructures: network versus cermet topologies for metallic PBG", Synthetic Metals 116 (2001) 419-426.*

*Primary Examiner*—Alexa D Neckel
*Assistant Examiner*—Golam Mowla
(74) *Attorney, Agent, or Firm*—Leighton K. Chong

(57) ABSTRACT

A solar power plant (10) capable of generating electricity comprising a light pipe carrying highly concentrated solar light (19), a hot reservoir (24), a cold reservoir (20), and a plurality of large-scale solid-state nano-structured photonic crystals (12) that are capable of recycling out-of-band photons with transition energies associated with a photovoltaic cell (13) into photons with in-band energies associated with the same photovoltaic cell (13) when photon energy is subjected to propagation through a thermal temperature gradient that is held across a suitably nano-structured photonic crystal (12). The input thermal photons from the hot thermal reservoir (24) are shifted in energy to the optimal photovoltaic cell energy for electron-hole pair generation by work that is expanded by the heat engine to convert said input photons into phonons and then back to photons again at a new wavelength through a process of phonon rethermalization occurring inside the nano-structured photonic crystal (12).

16 Claims, 11 Drawing Sheets

U.S. PATENT DOCUMENTS

| | | | |
|---|---|---|---|
| 5,865,906 A * | 2/1999 | Ferguson et al. | 136/253 |
| 5,932,029 A * | 8/1999 | Stone et al. | 136/253 |
| 5,932,885 A * | 8/1999 | DeBellis et al. | 250/493.1 |
| 6,204,442 B1 * | 3/2001 | Laqua | 136/253 |
| 6,489,553 B1 * | 12/2002 | Fraas et al. | 136/253 |
| 6,538,193 B1 * | 3/2003 | Fraas | 136/253 |
| 6,583,350 B1 * | 6/2003 | Gee et al. | 136/253 |
| 6,689,949 B2 | 2/2004 | Ortabasi | |
| 6,768,256 B1 * | 7/2004 | Fleming et al. | 313/501 |
| 7,767,903 B2 * | 8/2010 | Marshall | 136/243 |
| 2003/0155939 A1 * | 8/2003 | Lutz et al. | 324/760 |
| 2003/0156319 A1 * | 8/2003 | John et al. | 359/341.5 |
| 2003/0230336 A1 * | 12/2003 | Malfa et al. | 136/253 |
| 2005/0109386 A1 * | 5/2005 | Marshall | 136/253 |
| 2005/0109387 A1 * | 5/2005 | Marshall | 136/253 |
| 2006/0107995 A1 * | 5/2006 | Kovacik et al. | 136/253 |

* cited by examiner

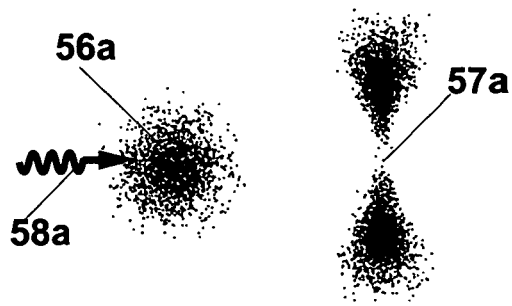
FIG. 6A
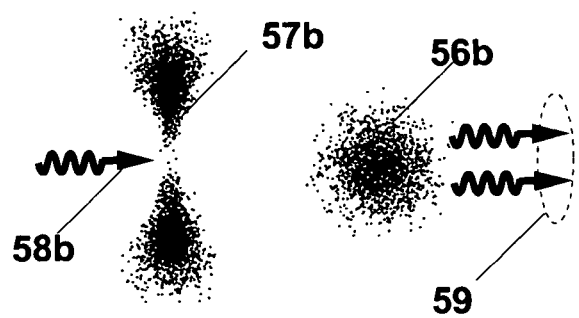
FIG. 6B
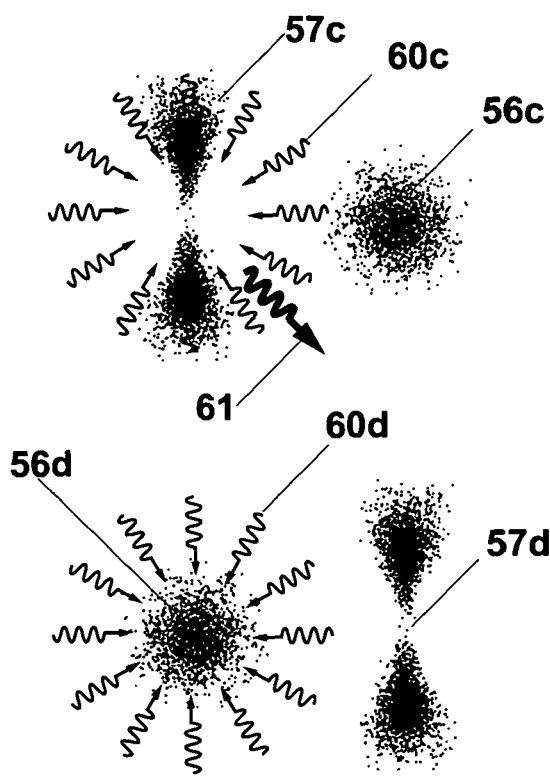
FIG. 6C
FIG. 6D

ELECTRIC POWER GENERATOR BASED ON PHOTON-PHONON INTERACTIONS IN A PHOTONIC CRYSTAL

CROSS-REFERENCE TO RELATED APPLICATIONS

Not Applicable.

FEDERALLY SPONSORED RESEARCH

Not Applicable

SEQUENCE LISTING OR PROGRAM

Not Applicable

BACKGROUND OF THE INVENTION

1. Field of Invention

The present invention relates the generation of electricity through a process that converts radiative heat energy into electricity through the use of photovoltaic cells, whereby photons are translated from out-of-band spectral regions of a photovoltaic cell to in-band spectral regions of the photovoltaic cell by means of intermediary phonons located in a nano-structured solid-state heat-engine, which is based on Photonic Crystals that can separate both photons and phonons spatially and energetically and apply the optimal energy photons to a photovoltaic cell to efficiently generate electricity.

2. Prior Art

Photovoltaic cells, also called solar cells, convert light into electricity by means of an electronic band-gap, which is typically formed as a pn-junction in a properly doped semiconductor such as Gallium Arsenide (GaAs) or Silicon (Si). The pn-junction has a built-in electric potential due to the space-charge depletion zone that is found in the vicinity of the transition from p-type material to n-type material. This electric potential is the cause of a corresponding built-in electric force field that can act on charges in the space-charge depletion zone to from a current in a closed loop electrical circuit that includes the photovoltaic cell. In particular, the process is initiated by an external photon that enters the space-charge depletion zone of the pn-junction and by its proximity causes the creation of an electron-hole pair if the incoming photon at least has the energy associated with the electronic band-gap of the pn-junction. If the photon has less energy than the electronic band-gap it may pass unobstructed through the device and if it has more energy than the electronic band-gap it may give up some of the energy to quanta of lattice vibrations, called phonons, while integer multiples of the electronic band-gap energy are converted into multiple electron-hole pairs. Any energy that is converted into phonons is typically lost as thermal heating of the photovoltaic cell.

FIG. 10 shows the Power Spectral Density (PSD) 107 of the sun versus the energy of the individual photons. The shape of the distribution is a strong function of the temperature of the sun and this depends on the fuel being fused and the strength of the gravitational field of the star. Note that energies for photons are always positive but FIG. 10 also shows negative energies. These negative energies correspond to the bound states of electrons 100 in the valance band 108 of the semi-conductor of the solar photovoltaic cell. As can be seen an electron 100 that is deep in the valance band 108 can be excited from its current state to an excited state 101 in the conduction band 109. The photon that excites this transition must have energy corresponding to the energy jump 102. However, the energy 102 is greater than the band gap energy, which lies between the conduction band edge 105 and the valance band edge 106. As a result phonons may be excited from the conduction band 104 and the valance band 103 with more energy than is needed to create an electron-hole pair. This energy is lost to the heating of the material. Also photons with energies that are smaller than the electronic band gap will not interact with the device and therefore are lost as radiation that passes through the solar cell or is reflected back from the solar cell depending on the particular composition and geometry of the device. Again this is wasted energy.

In the prior art most of the incident energy is lost to lattice vibrations and therefore not converted into electricity because the electronic band-gap of the photovoltaic is relatively narrow. This is typical of the traditional single junction solar cell. To improve on the efficiency of the solar cells prior art has been developed that seeks to exploit the use of different electronic band-gaps formed by different embodiments of the pn-junction. Thus multiple electronic band-gap structures have been developed with pn-junctions with different electronic band-gaps. These are pn-junctions stacked vertically or laterally. For example it has been reported at a National Center for Photovoltaic (NCPV) conference in Denver, Colo. in Apr. 16-19, 2000 that triple vertical junction GaInP2/Ga/As/Ge concentrator cells developed by the National Renewable Energy Lab (NREL) and Spectrolab have achieved 32.2% efficiency at 47 suns and 29% efficiency at 300 suns with an Air Mass of 1.5 at 25 degrees Celsius. As the number of layers of a stacked photovoltaic device increases the mutual interference between layers, caused by lattice mismatches, increases causing increased light absorption and reduced performance of the solar cell.

In an alternative embodiment consisting of the lateral placement of different electronic band-gap photovoltaics there have been at least two approaches taken. The present author was part of the studies at NASA Jet Propulsion Laboratory (JPL) in the late 1990's that were focused on Solar Space Power (SSP). One of the efforts being developed at the time was a "Rainbow" approach that used optical components like prisms to spread out solar radiation into its component colors and then develop photovoltaics that were optimized to the specific color (energy) of the light. This proved to be difficult due to the large amount of hardware required, especially for spaceflight hardware, which is designed to be low mass.

Another prior art approach is given by U.S. Pat. No. 6,689,949, which is shown in prior art FIG. 11 and describes a light containment system that has multiple single junction photovoltaic cells that are coated with reflective type filters. Each of the photovoltaic cells shown in this prior art have different band gaps. The generation of phonons 103 and 104, as shown in FIG. 10, is avoided in FIG. 11 by using multiple reflect type filters that are on the outer surface of the photovoltaic cells in order to reject out-of-band photons. The reflected and out-of-band radiation are recycled by making multiple reflections in the containment sphere. These reflections are essentially stochastic in nature and bounce around the inside of the sphere until the photon falls on a photovoltaic cell that is matched to its energy for conversion to electricity—or is parasitically absorbed. This approach still requires that multiple designs be developed for the photovoltaic cell. Additionally, the overall efficiency will still greatly depend on the number of bounces that that input photon uses before makes. Large numbers of bounces greatly increase the probability of absorption and dissipation as heat. Finally, and most importantly this prior art is unable to exploit temperature differences to generate electricity. The prior art of FIG. 11 is restricted to light only. This precludes applications such as turning the heat energy generated by a nuclear reactor directly to electricity.

These disadvantages are overcome in the present invention.

OBJECTS AND ADVANTAGES

In accordance with the present invention, a photovoltatic converter (PVC) module is provided which can operate at a concentration range of 500-1000 suns or more and provide a scalable power output that may range between several kilo-Watts to power levels on the order of 1 MegaWatt or more depending on the physical size of the embodiment used. The PVC must be run between a hot source and a cold source, such as—but not limited to—cold sea water, or snow pack, or deep space, or altitude and may draw its energy from one or more sources such as light from the sun, or the enthalpy of reaction from a combustion process, geothermal process, or from the heat generated by a nuclear reactor during a fission or fusion process. The disclosed PVC module is an enabling technology to reach very high solar-to-electric conversion efficiencies. More generally, the disclosed PVC is an enabling technology to reach very high solid-state heat-engine conversion efficiencies. Connecting a plurality of such modules together in a power plant permits the power plant to generate many hundreds of MegaWatts of electric power. Additionally, because of the extreme temperature present inside the PVC it is possible to have secondary processes present that take advantage of the environment. The two most notable examples of this are 1) the super heating of sea water for reducing the electricity required from the power plant to electrolyze the water and 2) the disassociation of Methane Hydrates by a process of pyrolysis into pure water, hydrogen, and pure carbon. Other secondary process are also possible.

The PVC module comprises:
  (a) an outer heat reservoir housing at one temperature polarity and containing an internal cavity of any closed shape inside said outer heat reservoir housing, the internal cavity having a unique surface area, and another surface either within said internal cavity or as a separate part of the outer heat reservoir housing that takes the opposite polarity temperature;
  (b) a light absorber that captures an intense flux of solar photons and converts them into an intense flux of phonons and thus becomes the hot polarity thermal reservoir;
  (c) at least one nano-structured photonic crystal that is fixed between a hot thermal reservoir and a cold thermal reservoir that controls energy flow of both photons and phonons in both energy and spatial direction so as to recycle out-of-band photons into in-band photons through the use of intermediary phonons, which spectrally shifts the unusable light energy into the usable band through the expenditure of thermal energy;
  (d) a plurality of solar cells optimized for converting the narrow-band light that is output from said nano-structured photonic crystal structures into electricity.

Accordingly, several objects and advantages of the present invention are:
  1. to provide a solid-state electricity generator that can take concentrated sources of photons and convert them into electricity;
  2. to provide a solid-state electricity generator that can take concentrated sources of phonons and convert them into electricity;
  3. to provide a solid-state electric generator that has no large voids and therefore can withstand great pressures in the depths of the oceans without being crushed;
  4. to provide a solid-state electric generator that can operate in deep space;
  5. to provide a Photonic Crystal Structure that can separate photons by direction of propagation;
  6. to provide a Photonic Crystal Structure that can separate photons by energy (color);
  7. to provide a Photonic Crystal Structure that can translate photons of one energy to another energy by means of phonons in a heat engine;
  8. to provide a means to rethermalize out-of-band light energy into in-band light energy for a photovoltaic cell;
  9. to provide a means to only use single junction solar cells to capture most of the sun's radiation instead of multi junction multiple band solar cells;
  10. to provide a means to generate electricity from light or alternately from other intense heat sources at the same time;

Further objects and advantages will become apparent from a consideration of the ensuing description and drawings in which like reference designations represent like features throughout the FIGURES.

SUMMARY

In accordance with the invention, an electric generator comprises a hot reservoir, a cold reservoir, and a solid-state nano-structured photonic crystal capable of recycling out-of-band photons into in-band photons of the photovoltaic cell when the photons are subjected to propagation through a thermal temperature gradient that is held across the photonic crystal while the thermal photons are still inside of the nano-structured Photonic Crystal.

DRAWINGS

Figures

The drawings referred to in this description should be understood as not being drawn to scale except if specifically noted.

FIG. 6A shows an s-orbital of an atom transforming into a p-orbital of the atom in a process of stimulated absorption within the host material that makes up the nano-structured photonic crystal;

FIG. 6B shows a p-orbital of an atom transforming into an s-orbital of the atom in a process of stimulated emission within the host material that makes up the nano-structured photonic crystal;

FIG. 6C shows a p-orbital of an atom transforming into an s-orbital of the atom in a process of spontaneous emission within the host material that makes up the nano-structured photonic crystal;

FIG. 6D shows an s-orbital of an atom transforming into a p-orbital of the atom in a process of spontaneous absorption within the host material that makes up the nano-structured photonic crystal, this process is shown for comparison purposes and has exceedingly small probability of occupance;

Figure 11:
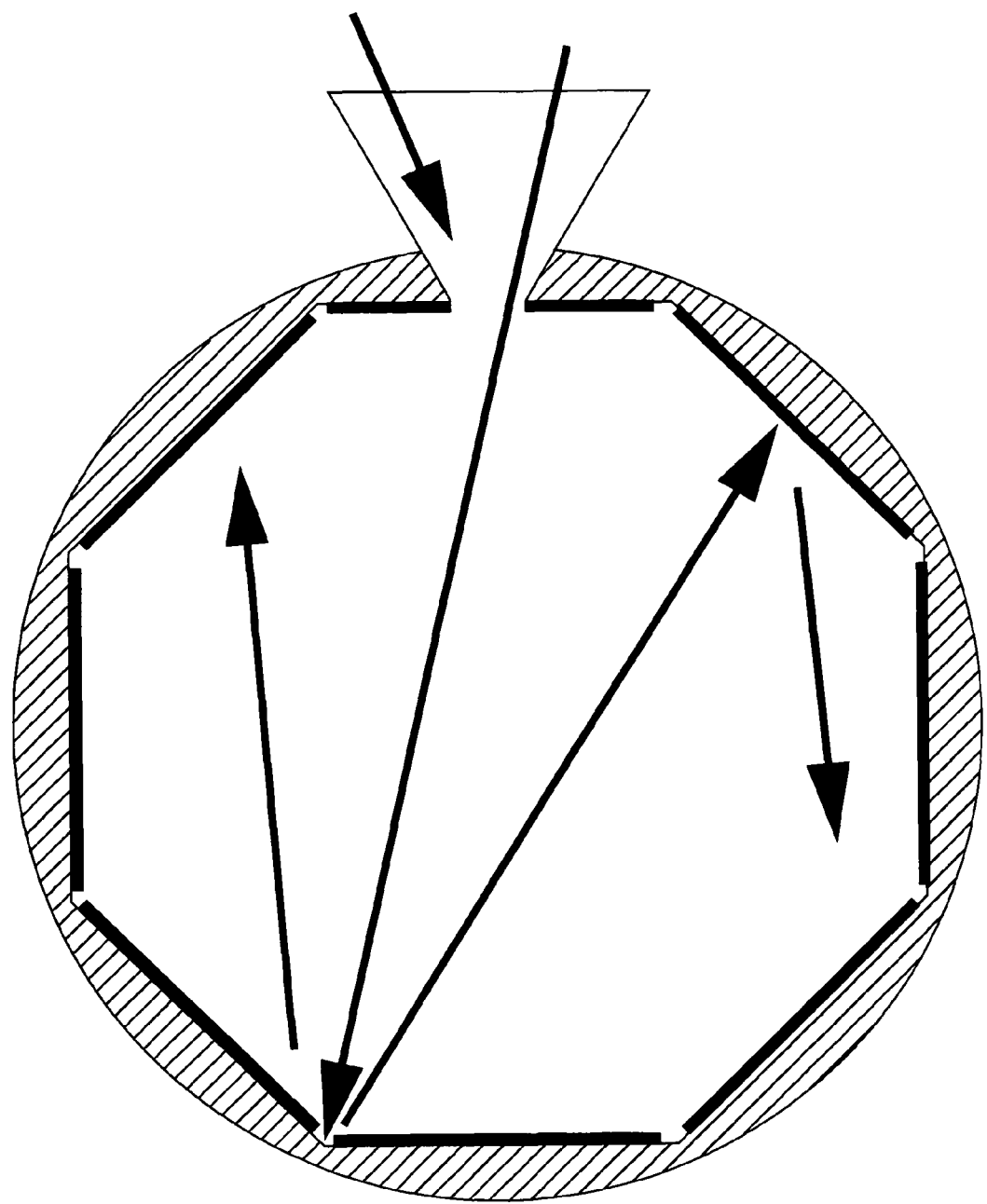

FIG. 11 is a schematic depiction of a prior art light containment electric generator from U.S. Pat. No. 6,689,949.

DETAILED DESCRIPTION

FIGS. 1, 2, 3A, 3B, and 4—Preferred Embodiment

Figure 1:
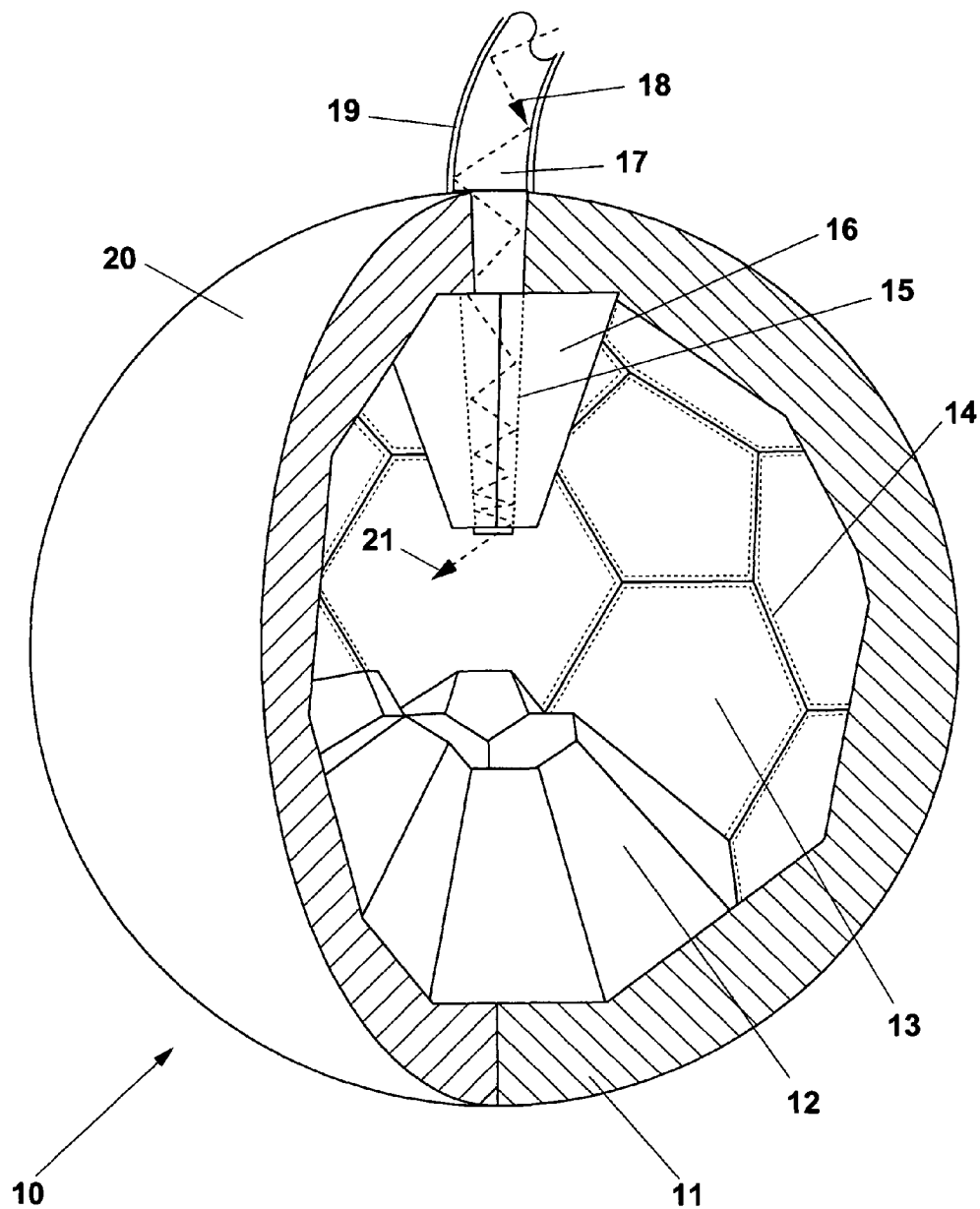
FIG. 1 depicts a solid-state heat engine that is based on photonic crystal structures, which are heated by an input flux of intense solar radiation.
Figure 2:
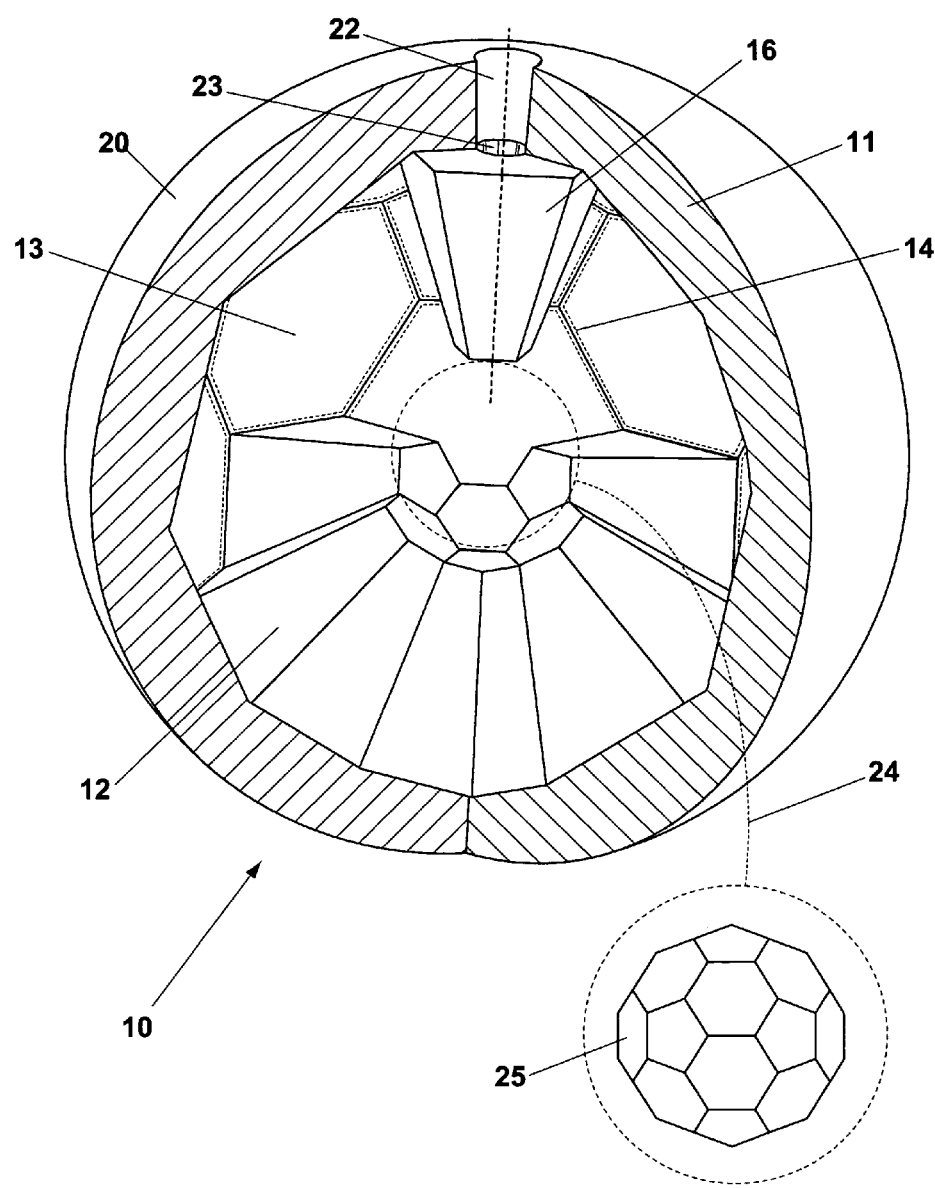
FIG. 2 depicts a different view of the photonic crystal heat engine as well as the core light absorber.

A preferred embodiment of an electrical power generation plant 10 is illustrated in both FIG. 1 and FIG. 2, which show views of the embodiment from different observation directions. The outer shell 20 is both a low temperature reservoir and a pressure vessel. The outer shell is constructed from a high thermal conductivity material 11 such as a metal stainless steel and may also have heat radiating fins (not shown) to assist in transferring unused heat energy out of the PVC module. Entering through the outer shell is a feed-through conduit 22 that passes light 18 from an external light conduit 19, having a reflective surface 17, through to light pipe 15 that is cut in a photonic crystal structure 16. The solar radiation 18 is collected from a remote location (not shown). In the preferred embodiment a light conduit 19 may be wrapped in electrical conductors and electrically insulating material so that the electricity that is generated by an electric power generation plant 10 may run back along the same cable structure to conserve space (not shown). A input solar radiation 18 passes through a section of Photonic Crystal Structure (PCS) 16 with a built in light pipe 15 that exits as input light energy 21 into the core region that is a high temperature reservoir 24.

Figure 3A:
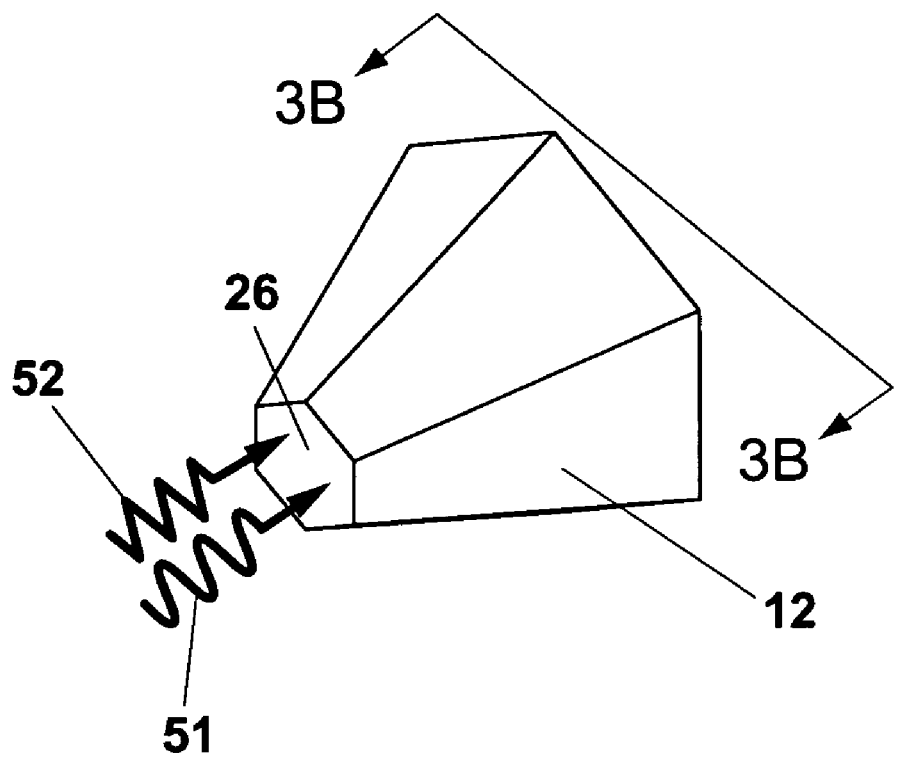
FIG. 3A is a close up of a typical photonic crystal section that is used in the heat engine.
Figure 3B:
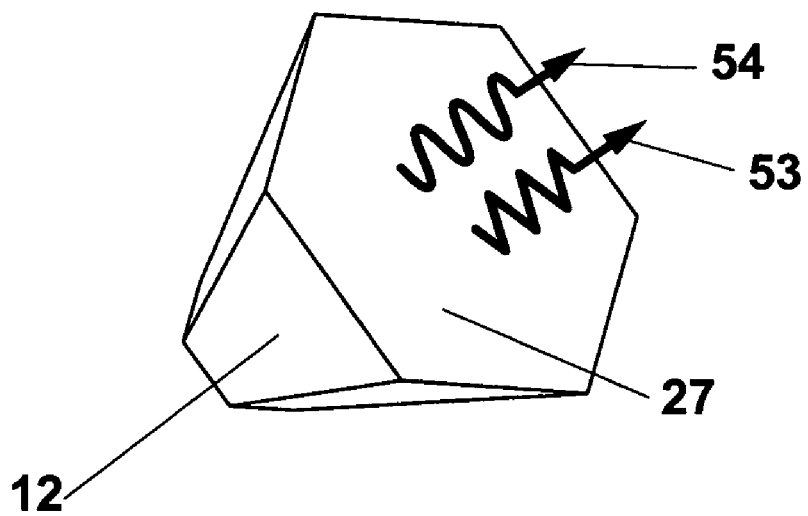
FIG. 3B is another close up view of a typical photonic crystal section that is used in the heat engine.

The electric power generation plant 10 encloses multiple sections of nano-structured photonic crystal 12 that uses a physical cross-section that is geometrically consistent with filling the internal cavity of electric power generation plant 10. In the present embodiment this is a truncated pyramid 12 with a hexagonal shape, pentagonal shapes are also present as can be seen in FIG. 1, FIG. 2, and FIG. 3. The internal cavity may take any shape but the preferred embodiment has the form of a polyhedron such as a truncated icosahedron, which is almost spherical in three dimensions but has 32 locally flat surfaces to accommodate the flat photovoltaic cells 13. In the present form the locally flat surfaces fit photovoltaic cells 13 with a hexagonal or pentagonal geometry. Between each solar cell is a small gap 14 that provides needed volume to fit the solar cells and provides some room for thermally induced length changes. The core volume 24 contains a material 25 that is preferably made from a strong solar absorber with a large specific thermal capacity such as, but not limited to, a hot liquid metal incased in a high temperature technical ceramic or a high temperature quartz glass doped with light absorbing ions. Turning to FIG. 3B and surface 27, which is adjacent to the solar cells such as solar cell 30 in FIG. 4, passes the narrow-band light 54 that has been processed though the photonic crystal material 12. Surface, 26 passes both solar light 51 or directly applied heat 52 as from, but not limited to, absorbed solar light that is now a conductive heat flow of phonons moving from hot surface 26 to cold surface 27. Due to the temperature gradient that is across nano-structured photonic crystal 12 the photons and phonons internal to 12 interact with the nano-structured photonic crystal 12 to generate the desired narrow-band light in the direction of the photovoltaic cell, which is adjacent to surface 27. The hot reservoir is located at surfaces like hot surface 26 at the apex of a pyramid and the cold reservoir is located at surfaces like cold surface 27. The surface 27 thus passes the remaining heat 53 that must be radiated away to satisfy the second law of thermodynamics, which requires energy dispersal to occur whenever an energy transformation occurs.

Figure 4:
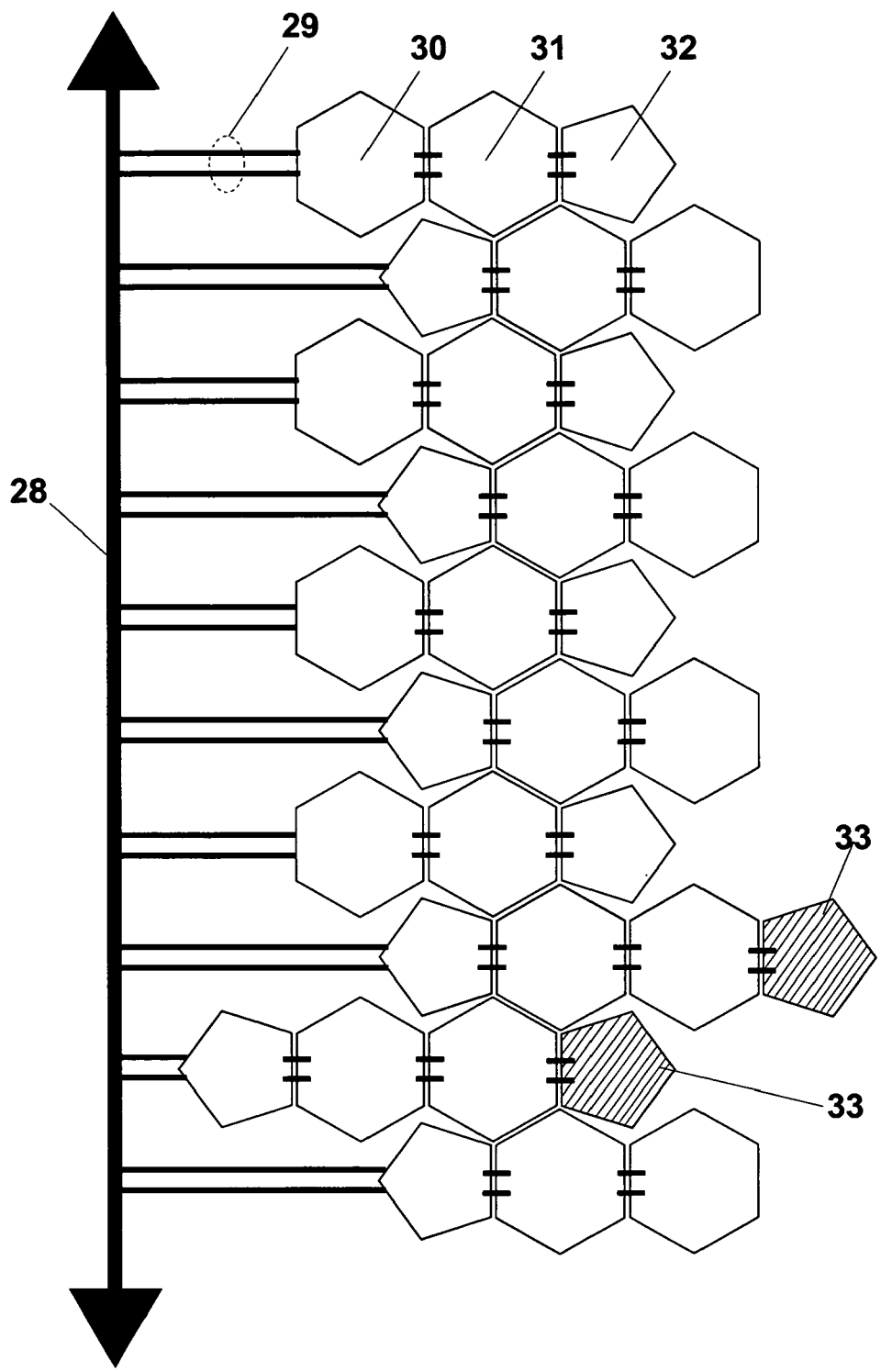
FIG. 4 is a top plan view, in schematic, depicting the principles of voltage matching of photo-voltaic cells in different positions in the heat engine.

FIG. 4 shows top level schematic of the solar cell power distribution network. The power bus 28 connects all of the sub circuits through connections 29. The subcircuits consist typically of three elements in electrical series connection: a pentagonal solar cell array 32, and two hexagonal arrays 31 and 30. Other geometries may also be used. In the case of arrays with a fourth extra element 33 the fourth element may be attached in line with or connected in parallel to the core three elements to provide extra current. The electrical details of this parallel electrical connection are not indicated in the diagram.

Operation

FIGS. 1 to 10—Preferred Embodiment

To describe how the PVC works it is necessary to first understand the way in which thermal photon radiation is generated and is coupled to phonons. Consider atoms that are embedded in a homogenous medium. In particular, consider FIG. 6A. On the left is the outer s-orbital electron configuration 56a of an atom that is in the host material of the photonic crystal. Typically this material is a glass like quartz or pyrex. The s-orbital 56a intercepts a photon 58a and becomes excited into a p-orbital 57a through a process called stimulated absorbtion. The atom to which this p-orbital 57a is associated can now vibrate as part of the dielectric lattice, this vibration is also quantized and leads to a phonon (not shown) and this increases the temperature of the host material. Alternately, the atom can be hit by another photon of the exact same energy as shown in FIG. 6B. Now note that an excited p-orbital 57b is sent into the s-orbital state 56b by the absorption of photon 58b in a process called stimulated emission. The result is that the material glows a bit more as light energy 59 is liberated. In FIG. 6C also note that from any of $4\pi$ steradians a quantum vacuum fluctuation 60c can cause the excited p-orbital 57c to radiate a photon 61 into an intrinsically unknowable direction, this is called spontaneous emission. The result is that a bit of radiant energy is sent into the homogenous dielectric in an intrinsically unknowable direction. Finally, in FIG. 6D it is noted that a process where vacuum fluctuations 60d excite the s-orbital of a host atom 56d to promote it to a p-orbital 57. This is a process of spontaneous absorption and it does not appreciably occur throughout a large ensemble of atoms. That is, the energy state of the material can not spontaneously increase if the material has many atoms in it as this would be equivalent to energy becoming spontaneously and locally concentrated and not dispersed, as required by the second law of thermodynamics. Although not strictly disallowed, in the limit of large numbers of atoms, as is the case of the atoms of the photonic crystal, it is not expected that such processes will contribute in large numbers. Note, that other orbital configurations are possible and those of FIGS. 6A-6D are strictly representative. Therefore, based on FIGS. 6A, 6B, and 6C one that is skilled in the science and art of quantum mechanics and the thermodynamics of detailed balance can show that there exists a function that describes all these interactions, it is a well known function called the Planck's Black Body distribution. This function is influenced strongly by the assumption that spontaneous emission can occur in any of the $4\pi$ steradians. However, in a photonic crystal not all these modes are available.

Figure 7A:
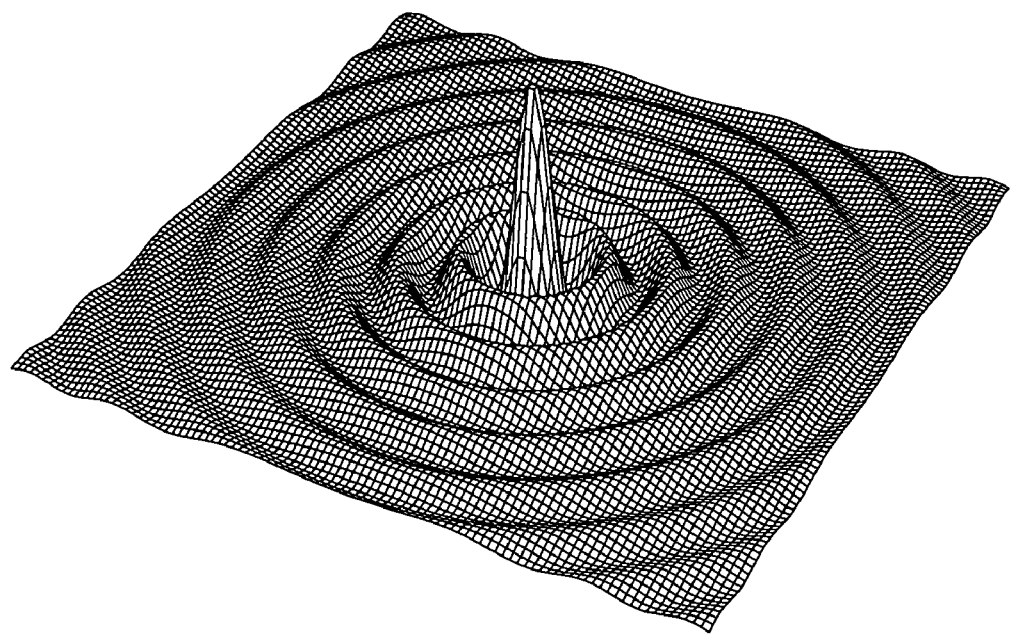
FIG. 7A shows how a single stone thrown into a pond, or equivalently a point source for electromagnetic wave propagating in two dimensions, can manifest wave behavior.
Figure 7B:
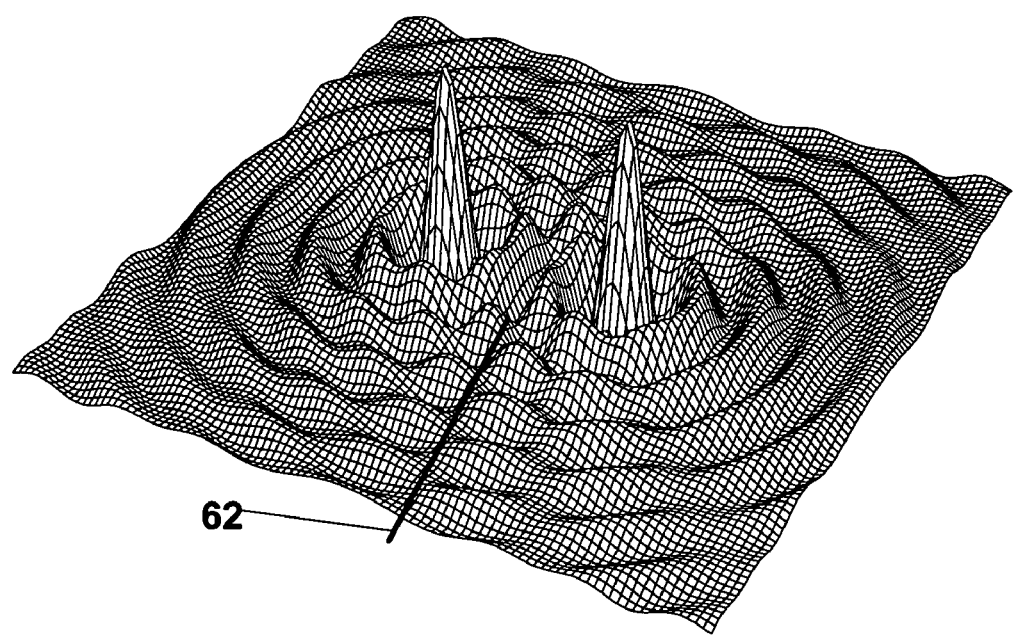
FIG. 7B shows how two stones thrown into a pond simultaneously, or equivalently two electromagnetic point disturbances, can interfere with each other to produce a null wave pattern along a particular direction.

Therefore, in this invention the assumptions that are made in the description of the black body are no longer valid because of the presence of the photonic crystal material. FIGS. 7A and 7B begin to describe what a photonic crystal is by making an analogy to stones thrown into a pond. In FIG. 7A the stone causes waves to be generated that spread out from the point of initial disturbance. If, instead, two stones into the pond simultaneously, as is indicated in FIG. 7B, then there are two waves that are propagating and that overlap to give constructive and destructive interference. In some directions like the direction indicated by the line 62 there is destructive interference. In other directions there may be constructive interference. This analogy is directly applicable to electromagnetic waves as well. In particular, those familiar with the art of photonic crystals know that in three dimensions there exist crystal structures, like that schematically shown in FIG. 8A, which will suppress the propagation of radiation in any direction—destructive wave cancellation in all directions. The photonic crystal has a periodically varying dielectric constant. The periodicity is applicable in three spatial dimensions and the varying dielectric constant acts as scattering centers, a kind of three dimensional pond, which will not allow the propagation of radiation in any direction even after a disturbance has occurred. This is a very special property that essentially makes an insulator for light just like rubber is considered an insulator for electrons. These materials are called photonic band gap materials and are a special case of photonic crystals. All the discussion up to this point is well known physics. However, this invention is based on a new appreciation of the physics of cancellation of electromagnetic waves generated thermally inside a photonic crystal, possessing strategically chosen photonic band gaps. Such a photonic crystal does not have a complete photonic band gap because that narrow-band part of the thermal radiation, which is also associated with the electronic band-gap transition of a photovoltaic cell, must be allowed to propagate to the photovoltaic cells.

The present author, while working for Caltech at NASA's Jet Propulsion Laboratory, developed the governing physical equations for photonic crystal structures that interact with both photons and phonons. These equations are highly coupled intero-differential equations that relate the spectral radiant intensity to the temperature, temperature gradients, nano-structure geometry, material thermal parameters, electromagnetic constitutive parameters, eigen solutions of Maxwell's Equations for a photonic crystal, thermal boundary conditions, light boundary conditions, the driving thermal sources, the driving light sources such as the sun, and the coordinate position inside the photonic crystal material.

Figure 8A:
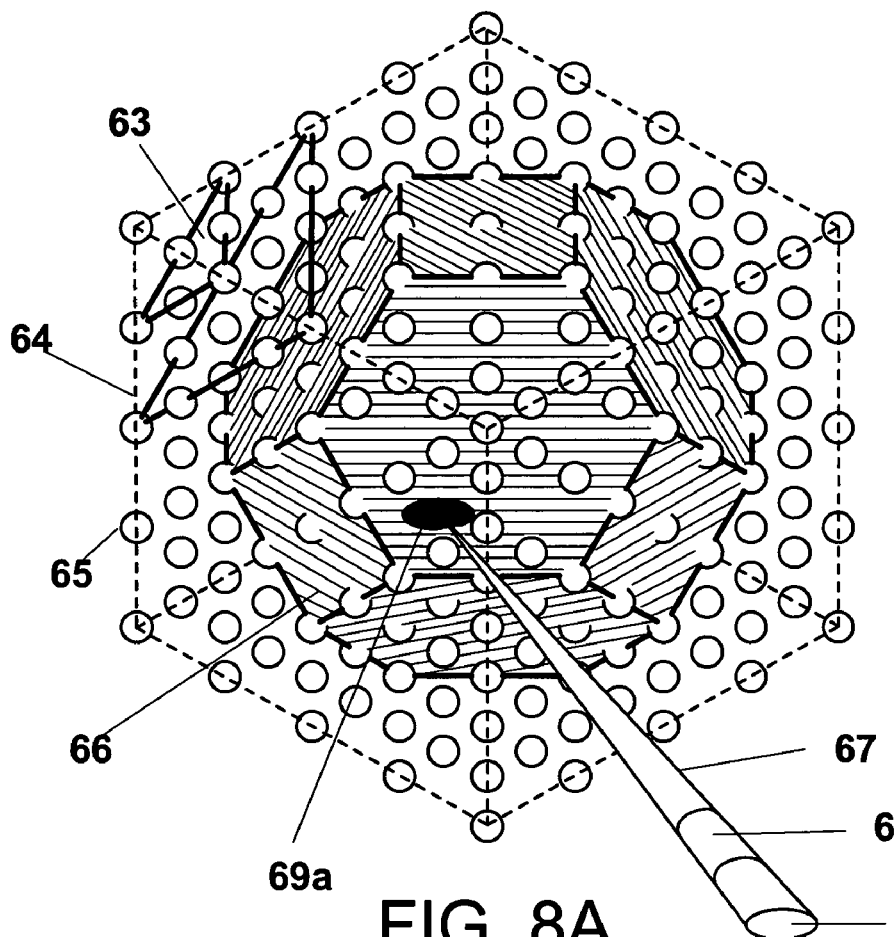
FIG. 8A shows a representative photonic crystal structure with its corresponding first Brillioun zone, additional principal crystallographic cut planes, and a light cone that is used to define the spectral radiant flux intensity.
Figure 8B:
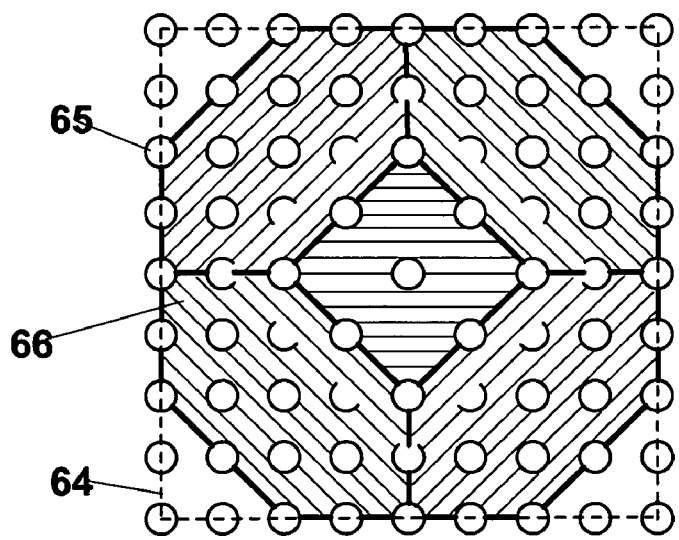
FIG. 8B shows the same photonic crystal structure from an alternative orientation.

In order to understand what is meant by radiant spectral intensity consider FIG. 8A and its alternate view FIG. 8B. Consider a cone of photon energy carriers—this is a mathematical object called a light-cone 67—embedded in a photonic crystal material. The light-cone carries photons with a narrow band of angular-frequencies $d\omega$ centered at angular-frequency $\omega$. Additionally, the energy of the photons is $d^4Q_\gamma$. These photons are propagating in the direction from the differential area 69a to the projected differential area $dA_\perp$ at 69b, while the light-cone itself subtends a solid angle $d\Omega$. The source area element dA 69a can be imagined to slide up the light-cone 67 until its perimeter intersects the cone. At this position create a differential volume element $d^2V$ in the form of a small differential cylinder 68, this volume contains the photons under consideration and they have energy $d^4Q_\gamma$. If the differential area 69a was part of the surface of a black body then the total flux of radiant energy through the surface dA at 69a would be zero—because half of the energy would be propagating in the direction from 69a to 69b and the other half would be travelling in the opposite direction. However, under nonequilibrium conditions the total flux is non zero. It is desired to describe the light intensity under both equilibrium and nonequilibrium conditions in the photonic crystal. However, first note the periodic crystal structure 64 that is defined by lattice sites 65. In this structure there are cut planes such as that shown at 63. Atoms that radiate thermally on this plane will tend to destructively add with the radiation from the next plane if the plane spacing is half a wavelength of the light. Therefore, those directions that are defined by the normal directions to all such cut planes are can be thought of as potential band gap directions. These directions are easily visualized by the first Brillioun zone 66, which shows the directions that are most easily formed into band gap directions where no radiation is allow to propagate.

From FIG. 8A define the Spectral Intensity $I_\omega$ in terms of the light cone 67 shown that is propagating through a medium. The medium may be a uniform medium or it may be a nano-structured medium 64 as shown in FIG. 8A. In particular, it is defined as the photon energy per unit time dt, per unit projected area $dA_\perp$ at 69b, per unit solid angle $d\Omega$ subtended by 67, per unit radian frequency $d\omega$ contained in 67, so that $$I_\omega = \frac{d^4 Q_\gamma}{dt \, dA_\perp \, d\Omega \, d\omega}. \qquad (1)$$

The present author has shown that a nano-structured photonic crystal structure can be described by two equations in two unknowns—the spectral intensity distribution and the temperature distribution. The first equation consists of a first order differential equation that has both a loss term and a forcing function. The loss term is proportional to the local spectral intensity in a given direction and the proportionality constant is the bulk absorptivity $\alpha_\omega$ of the host material from which the photonic crystal is fabricated. As shall be seen, without a forcing function this is simply the classical Beers Law, which describes the exponential decrease in the spectral light intensity with penetration depth into a material. However, by the application of quantum mechanics and the principle of detailed balance it is possible to show that there must also be a forcing function term (right hand side of the following equation) that is very similar to the classical form of the Black Body law derived by Planck. The main difference is that in a photonic crystal the energy velocity $\upsilon_\omega$ is given in terms of the photonic crystal intrinsic eigen energy velocities $\upsilon_\sigma$, which depend on the propagation quantum numbers $\sigma$. Additionally, the forcing function for the photonic crystal depends on a numerically determined function called the Photonic Crystal Thermal Total Density Of State (TDOS) function $$\tilde{\rho}_{TDOS}^{(pc)}(\omega),$$

which accounts for the overlap of the periodically varying dielectric function with the eigen field solutions from Maxwell's equations. The first governing equation is for atoms in the host material of the photonic crystal that have two level atomic transitions that couple to photons and phonons. In particular, $$\left.\frac{dI_\omega}{ds}\right|_{2-level} + \alpha_\omega I_\omega = \alpha_\omega \left(\frac{\upsilon_\omega \cdot \hat{m}}{4\pi}\right)\frac{\hbar\omega\tilde{\rho}_{TDOS}^{(pc)}(\omega)}{e^{\hbar\omega/k_B T}-1},$$

where s is the path length along a direction of interest inside the photonic crystal material and $\hat{m}$ is a local unit vector, which is tangent to s in the direction that one seeks to know the value of the spectral light intensity. If the temperature spatial distribution T=T(r) is known it is then possible to solve this equation directly to obtain $T_\omega$ along the path length s. However, T(r) is almost never known so that it is necessary to solve for both T and $I_\omega$ need then exists to use a second equation that is based on energy balance, the resulting equation is given by $$C_p\rho\frac{\partial T}{\partial t} - \nabla\cdot[K_h\cdot\nabla T] + \int_{4\pi}\int_0^\infty \frac{dI_\omega}{ds}d\omega d\Omega = q,$$

where in general $C_p$ is the heat capacity at constant pressure, $\rho$ is the mass density, T is the absolute temperature, $K_h$ is the tensor heat conductivity, and q is the energy per unit volume that is gained or lost inside the photonic crystal structure. These last two equations are differential equations that represent a boundary value problem. The boundary values of the intensity and the temperature (or the associated derivatives) must be specified to solve these equations.

The very important point to understand from these equations is that by shining intense sunlight on a portion of a photonic crystal material we are specifying the mathematical boundary condition associated with the hot side of a heat engine. Also by specifying a cold temperature on another portion of the photonic crystal—perhaps due to a large thermal bath of sea water or snow—we are specifying the mathematical boundary condition associated with the cold side of the heat engine. The photonic crystal that lies between the hot side and the cold side of the heat engine then comes to a state of dynamic equilibrium, after an initial start up transient, and at that point a balance is achieved between the flux of phonons, associated with $-\nabla\cdot[K_h\cdot\nabla T]$; the flux of photons, associated with $$\int_{4\pi}\int_0^\infty \frac{dI_\omega}{ds}d\omega d\Omega;$$

any internal sources or sinks of energy q.

By designing the photonic crystal to exhibit a PBG for a particular set of frequencies and a particular set of directions we can arrange for light energy to be converted into conductive heat energy and vice versa. In particular we can arrange for light energy that is out of the optimal band of operation of a photovoltaic cell to be converted to phonons and for some phonons to be converted into light at the optimal narrow band. This process does not come for free and energy must be expended for this to happen. This is the reason why a thermal gradient is needed—to provide the energy necessary to shift the frequencies of out-of-band photons into in-band photons.

Figure 5A:
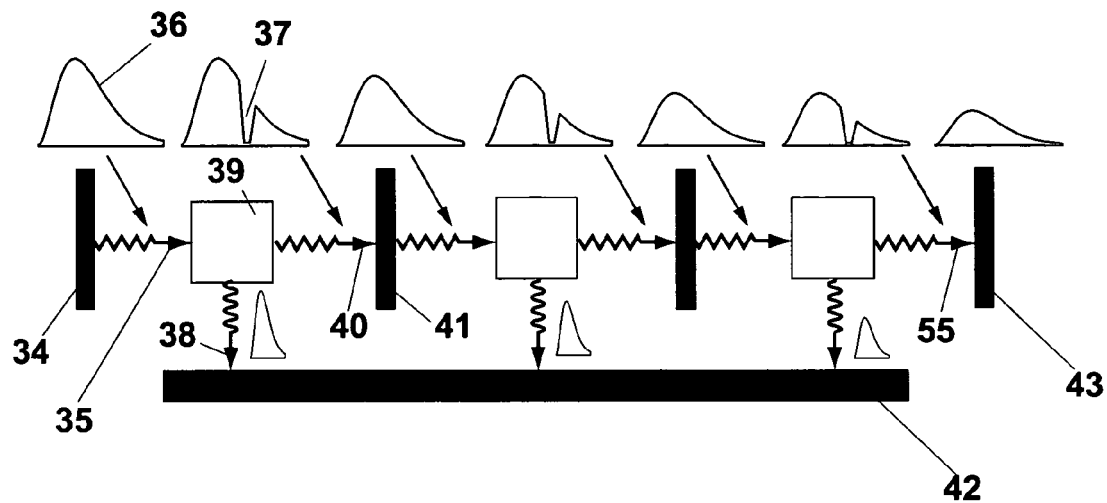
FIG. 5A shows the flow of photon and phonon energy schematically in a nano-structured Photonic Crystal such that narrow-band photons emerge at right angles to the direction of conductive heat flow and are absorbed by a photovoltaic cell.
Figure 5B:
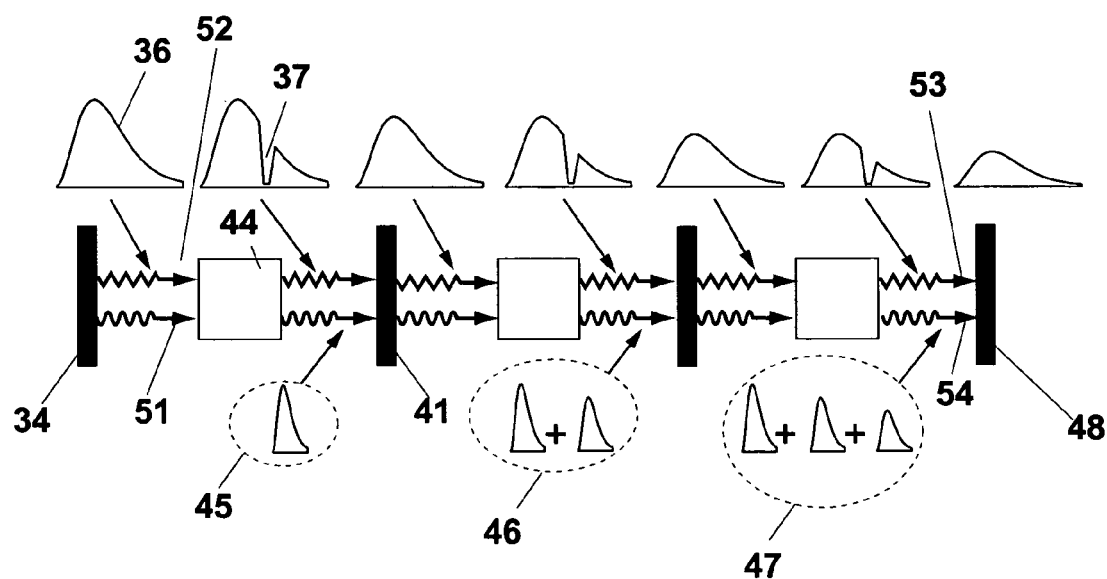
FIG. 5B shows the flow of photon and phonon energy schematically in a nano-structured Photonic Crystal such that narrow-band photons emerge parallel to the direction of conductive heat flow and are absorbed by a photovoltaic cell.
Figure 10:
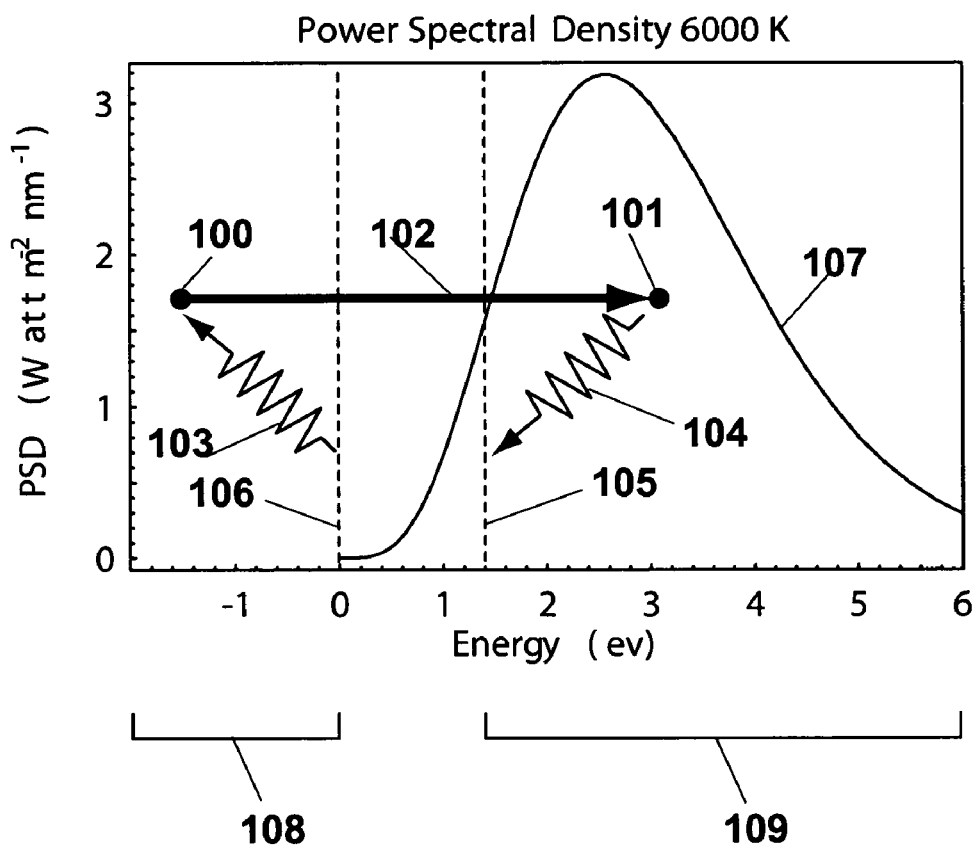
FIG. 10 shows on coordinates of Power Spectral Density versus wavelength both the output of the Sun and the electron band gap of a typical photovoltaic cell.

We can understand the results of this process through a less mathematical description. Consider FIG. 5A, which shows, in schematic, three differential pieces of photonic crystal. We shall describe the operation of the first differential piece 39 and the others then follow. The pieces of photonic crystal that are shown in FIG. 5A and FIG. 5B are assumed to be adjacent to each other spatially. The differential piece of material 39 has boundary temperatures depicted by a hot boundary on its immediate left 34 and a colder temperature boundary to the right 41. This represents a temperature gradient and by establishing this gradient we force phonons to flow in the direct that is opposite to said gradient, that is in the direction from left to right in FIG. 5A. That is, conductive heat energy flows from regions that are hot to regions that are cold and never in the reverse direction under natural and unforced circumstances. The phonons that are flowing into 39 from boundary 34 are described by the Planck-like phonon distribution 36 which shows, on coordinates of relative power spectral density versus wavelength, the power content of the phonons. Since the differential piece of nano-structured photonic crystal has an approximately uniform temperature we can think of it as radiating approximately according to the Planck Black Body distribution. However, as we shall discuss shortly, the thermal radiation from said differential piece of photonic crystal material 39 is not uniform in all directions. The choice of the detailed nano-structure of 39 will cause the thermal radiation to propagate in a particular direction while restricting the propagation of all other modes. In particular, FIG. 5A shows that this allowed mode is at right angles to the phonon flux. The phonon flux is indicated by 35 on the hot side of 39 and by 40 on the cold side of 39. The photon flux, i.e. light flux, is indicated by 38, which is seen to be at right angles to the phonon flux. In addition, the flux of thermal photons is not restricted to a particular direction but also to a particular energy or equivalently to a particular color of thermally generated light. In the preferred embodiment the structure of the differential piece of photonic crystal material 39 is chosen to only allow a narrow-band of photon energies to propagate in the orthogonal direction to the phonon flux. This narrow-band photon flux 38 corresponds to, and is matched with, the valance to conduction band energies of the photovoltaic cell as indicated in FIG. 10 by 106 and 105. In simple terms, we can say that the differential piece of material 39 glows radiantly with light from the intrinsic average temperature of the material but that the photons that are given off by the glowing process are restricted to propagate in a direction that is orthogonal to the conductive heat flow 35 and 40 and with an optimal energy (color) that will cause electron-hole pairs to be generated in a photovoltaic cell 42 with the greatest efficiency. The consequence of a small piece of the energy 37 of the lattice vibrations being removed is that that energy is free to propagate to the photovoltaic 42 through a photon propagation process 38 in the photonic crystal 39. Note, that the temperature boundaries 34 and 41 have temperatures T and (T−ΔT), where the change in temperature ΔT is a positive quantity, this established the movement of phonons in the general direction from 34 to 41. It also allows the lattice vibrations to rethermalize after the energy 37 is removed thus providing a new Planck-like power spectral distribution for the phonons but with diminished intensity relative to the previous phonon power spectral density 36 to the left of the next differential nano-structured photonic crystal section. After this process for each differential piece of photonic crystal 39 the remaining phonon flux 55 enters the coldest thermal reservoir 43. Note that under perfect conditions the thermodynamic free energy content of the process will be transferred to the solar cell 42 so that the total efficiency of the system is the product of the Carnot efficiency and the solar efficiency for the narrow band of frequencies that is sent to the solar cell. This narrow-band efficiency is limited by the quantum efficiency of the electron-hole pair generation process and is often greater than 90% so that the maximum efficiency of the device is within about 10% of the Carnot efficiency.

Note, the photovoltaic cell 42 has a length that spans the photonic crystal material from 34 to 43. This photovoltaic cell is bathed in optimally colored light to produce electricity. The light reaching 42 is most intense on the left side, which corresponds to the hottest part of the photonic crystal 34, and is most diminished on at that part of the solar cell which corresponds to the coldest part of the photonic crystal 43. This means that more electricity is generated from the solar cells on the left than on the right in FIG. 5A. This is an asymmetry that can lead to inefficiency and it can be removed by changing the direction of the allowed photon modes relative to the direction of phonon flux. This is shown in the preferred embodiment of FIG. 5B.

In FIG. 5B a different nano-structured photonic crystal 44 is used as the differential piece of material. In this case narrow-band photon energy 51 along with broad band phonon energy 52 is sent propagating in the same direction. Just as before, the photonic crystal operates on the thermally generated photons, but now the allowed propagation modes are in the same direction as the phonon flux, which is caused by the large temperature gradient between the hot reservoir 34 and the combined cold reservoir and photovoltaic cells located at 48. With this particular geometry we can see that each differential piece of nano-structured photonic crystal allows a small amount of narrow-band photon energy to propagate forward. The first differential photonic crystal sends the photon energy corresponding to 45 forward, the second differential photonic crystal add to 45 so that the total amount of narrow-band energy is shown in 46, continuing along in this way we get to the last differential photonic crystal and the total allowed energy that propagates towards the solar cell 48 is finally indicated by 47.

Note that FIGS. 5A and 5B show two extremes of operation. It is also possible to have the narrow-band photons propagate at an arbitrary angle relative to the phonon flux. By showing the embodiments of FIGS. 5A and 5B the possibility of using other configurations is not precluded.

Once the solar energy has passed through the individual photonic crystal elements 12 of FIG. 1 and FIG. 2, which have a thermal gradient on them, the resulting narrow-band light 54 is used to drive the photovoltaic cells such as 30-32. The resulting electrical energy is then available for distribution.

DESCRIPTION

Alternative Embodiment and Operation

Figure 9:
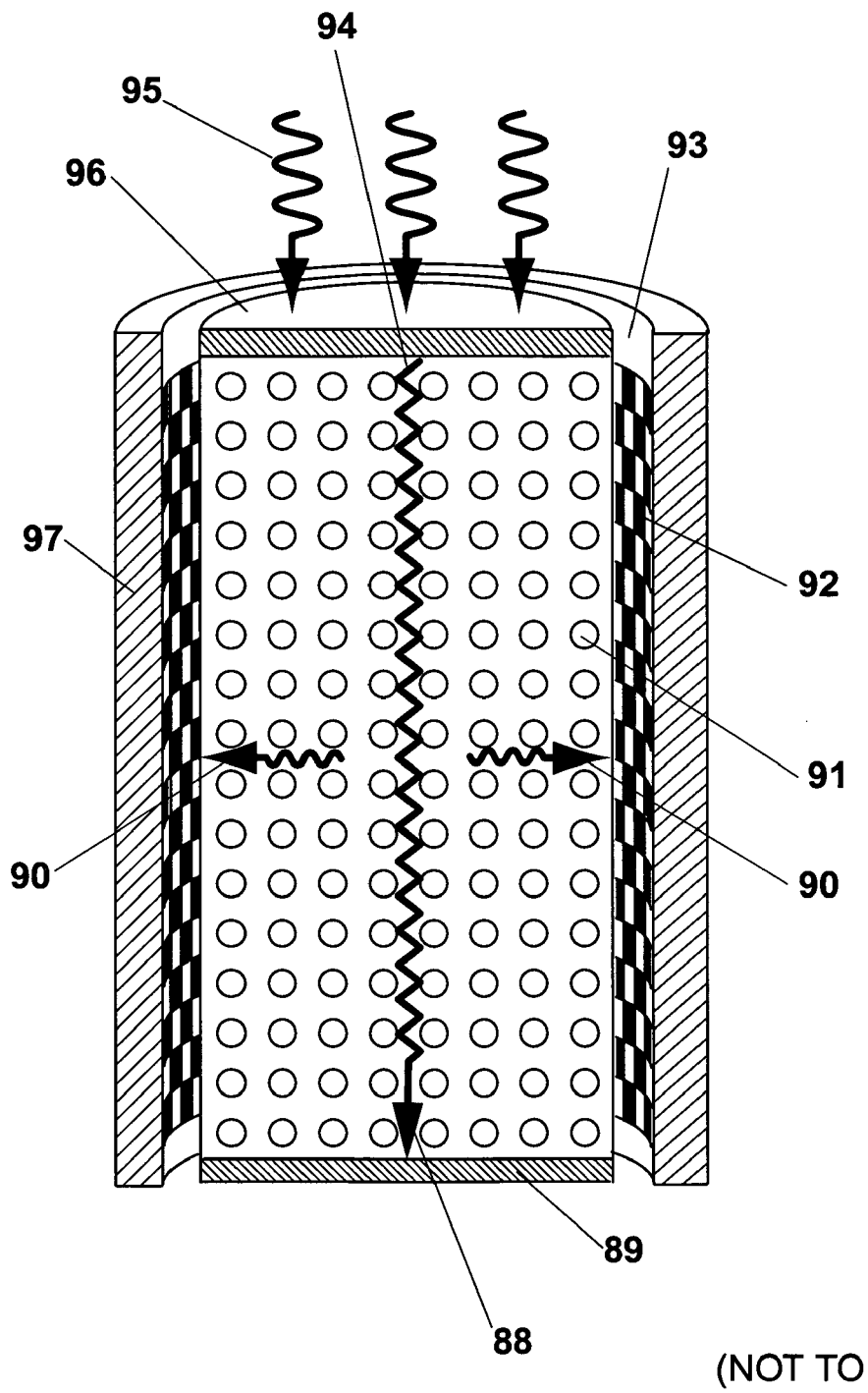
FIG. 9 is a representative example of an alternative embodiment of the photonic crystal heat engine.

An alternative embodiment is shown in FIG. 9. This is not the only alternative but it provides a representative example of such systems. Solar light 95 enters at the top of the heat engine and is absorbed by the high emissivity surface 96, this becomes the hot reservoir. The resulting phonons 94 propagate towards the cold reservoir at 89 by propagating through a photonic crystal 91. The crystal is chosen to operate in accordance to FIG. 5A so that as the radiation propagates from 96 to 89 it is rethermalized along the path. This results in the creation of narrow band light in the radial direction 90. This light impinges onto a photovoltaic array 92, which is wrapped around the photonic crystal, and thus produces electricity.

CONCLUSION, RAMIFICATION, AND SCOPE

Accordingly the reader will see that the heat engine of this invention can be used to provide electrical power from a solid state system. Furthermore, this type of power plant has the additional advantages in that:
1. it permits the production of electricity in any environment that can allow a temperature difference to be maintained;
2. it permits the secondary production of hydrogen and oxygen through the electrolysis of super heated water;
3. it permits the production of electricity even during time of low solar light levels or at night by including a separate large thermal reservoir, such as, but not limited to, water—which has a large heat capacity;
4. it can be made to wrap around the nuclear reactor of a submarine and directly create electricity for the submarine through the heat engine created between the nuclear reactor and the sea water;
5. it can be made to wrap around the nuclear reactor of a space satellite and directly create electricity for the satellite through the heat engine created between the nuclear reactor and the cold of sea of deep space;
6. it can be used, in conjunction with a solar collector, on a space-based satellite or platform to provide energy to said satellite or platform;
7. it can be used in groups or clusters to provide greater power output than just a single unit;

While the above description contains many specificities, these should not be construed as limiting the scope of the invention but as merely providing illustrations of some of the presently preferred embodiments of this invention. For example, the enclosure and the photonic crystal components can have other shapes such as: ellipsoidal, toroididal, and various non symmetric shapes so long as a large temperature difference can be maintained between the hot and cold reservoirs of the heat engine.

Thus the scope of the invention should be determined by the appended claims and their legal equivalents, and not by the examples given.

The invention claimed is:

1. A thermo-photo-voltaic electric power generator, comprising:

(a) a hot thermal reservoir that is maintained hot by an external source of thermal energy, (b) a cold thermal reservoir that is maintained cold by an external sink of thermal energy, (c) at least one photonic crystal thermally coupled between said hot thermal reservoir and said cold thermal reservoir and receiving an input of light energy from an external source therein, said photonic crystal being made of a selected photonic band-gap material and being formed with nano-structured crystal structures having a periodically varying dielectric constant in three dimensions which act as scattering centers that reinforce propagation of light energy in a predetermined desired direction and suppress propagation of light energy in other directions, said nano-structured crystal structures of said photonic crystal thereby operating to shift out-of-band thermal-photons of the input light energy into an output of in-band thermal-photons propagating in the predetermined desired direction while liberating in-band photon energy, and allowing phonon propagation along a direction from said hot thermal reservoir to said cold thermal reservoir, and (d) at least one photovoltaic cell that is positioned downstream in the predetermined desired direction from said photonic crystal for converting the output of propagating in-band thermal photons into electricity, wherein said nano-structured photonic crystal has a response to photon and phonon propagation which provides diffusion of phonon energy from said hot thermal reservoir to said cold thermal reservoir by means of spectral shifting and redistribution of photon energy into phonon energy and back again continuously, whereby said thermo-photo-voltaic electric power generator will generate electricity by converting part of the thermal energy passing through said nano-structured photonic crystal into said band of light energy that is used to generate electricity by the creation of electron-hole pairs in said photovoltaic cell, and wherein said hot thermal reservoir is formed by an inner core volume having a surface provided with a plurality of facets and being made of a material that has a large thermal capacity, and being coupled to an input of concentrated light energy through a light pipe coupled to an external source of concentrated light energy providing high thermal energy, wherein said cold thermal reservoir is formed by a spherical outer shell made of high thermal conductivity material which defines a three dimensional volume in which said inner core volume is positioned at its center, wherein the outer surface of said spherical outer shell is maintained cold by thermal coupling to the external sink of thermal energy, and wherein said at least one photonic crystal comprises a plurality of photonic crystal prisms each being thermally coupled between a respective facet of said inner core volume forming said hot thermal reservoir and a respective inner surface portion of said outer shell forming said cold thermal reservoir and receiving an input of light energy through the respective inner core volume facet from the external source therein.

2. The thermo-photo-voltaic electric power generator of claim 1, wherein said external source of thermal energy is solar energy.

3. The thermo-photo-voltaic electric power generator of claim 1, wherein the external sink of thermal energy is a relatively cold body of liquid.

4. The thermo-photo-voltaic electric power generator of claim 1, wherein the external sink of thermal energy is a relatively cold gas.

5. The thermo-photo-voltaic electric power generator of claim 1, wherein the external sink of thermal energy is a relatively cold vacuum of space.

6. The thermo-photo-voltaic electric power generator of claim 1, wherein said photonic crystal derives the output of in-band thermal photons primarily from out-of-band thermal photons passing through said photonic crystal.

7. The thermo-photo-voltaic electric power generator of claim 1, wherein said photonic crystal derives the output of in-band thermal photons in part from out-of-band thermal photons passing through said photonic crystal.

8. The thermo-photo-voltaic electric power generator of claim 1, wherein said photonic crystal derives the output of in-band thermal photons by thermally shifting optical thermal radiation from out-of-band thermal photons passing through said photonic crystal.

9. A thermo-photo-voltaic electric power generator, comprising:

(a) a hot thermal reservoir that is maintained hot by an external source of thermal energy, (b) a cold thermal reservoir that is maintained cold by an external sink of thermal energy, (c) at least one photonic crystal thermally coupled between said hot thermal reservoir and said cold thermal reservoir and receiving an input of light energy from an external source therein, said photonic crystal being made of a selected photonic band-gap material and being formed with nano-structured crystal structures having a periodically varying dielectric constant in three dimensions which act as scattering centers that reinforce propagation of light energy in a predetermined desired direction and suppress propagation of light energy in other directions, said nano-structured crystal structures of said photonic crystal thereby operating to shift out-of-band thermal-photons of the input light energy into an output of in-band thermal-photons propagating in the predetermined desired direction while liberating in-band photon energy, and allowing phonon propagation along a direction from said hot thermal reservoir to said cold thermal reservoir, and (d) at least one photovoltaic cell that is positioned downstream in the predetermined desired direction from said photonic crystal for converting the output of propagating in-band thermal photons into electricity, wherein said nano-structured photonic crystal has a response to photon and phonon propagation which provides diffusion of phonon energy from said hot thermal reservoir to said cold thermal reservoir by means of spectral shifting and redistribution of photon energy into phonon energy and back again continuously, whereby said thermo-photo-voltaic electric power generator will generate electricity by converting part of the thermal energy passing through said nano-structured photonic crystal into said band of light energy that is used to generate electricity by the creation of electron-hole pairs in said photovoltaic cell, and wherein said hot thermal reservoir is formed by an upper surface layer being made of a material that has a large thermal capacity which is coupled to an input of concentrated light energy from an external source of concentrated light energy so that said upper surface layer thereby is maintained hot by the external source of concentrated light energy providing high thermal energy, wherein said cold thermal reservoir is formed by a core body extending in an axial direction below said upper surface layer made of high thermal conductivity material which defines a three dimensional volume, and an outer surface surrounding said core body that is maintained cold by thermal coupling to the external sink of thermal energy.

10. The thermo-photo-voltaic electric power generator of claim 9, wherein said external source of thermal energy is solar energy.

11. The thermo-photo-voltaic electric power generator of claim 9, wherein the external sink of thermal energy is a relatively cold body of liquid.

12. The thermo-photo-voltaic electric power generator of claim 9, wherein the external sink of thermal energy is a relatively cold gas.

13. The thermo-photo-voltaic electric power generator of claim 9, wherein the external sink of thermal energy is a relatively cold vacuum of space.

14. The thermo-photo-voltaic electric power generator of claim 9, wherein said photonic crystal derives the output of in-band thermal photons primarily from out-of-band thermal photons passing through said photonic crystal.

15. The thermo-photo-voltaic electric power generator of claim 9, wherein said photonic crystal derives the output of in-band thermal photons in part from out-of-band thermal photons passing through said photonic crystal.

16. The thermo-photo-voltaic electric power generator of claim 9, wherein said photonic crystal derives the output of in-band thermal photons by thermally shifting optical thermal radiation from out-of-band thermal photons passing through said photonic crystal.

* * * * *